United States Patent
Ross

(10) Patent No.: US 9,021,292 B2
(45) Date of Patent: Apr. 28, 2015

(54) METHOD AND SYSTEM FOR ASYNCHRONOUS SERIAL COMMUNICATION IN A RING NETWORK BY GENERATING AN OVERSAMPLING CLOCK USING A FRACTIONAL RATE MULTIPLIER AND SAMPLING A RECEIVED DATA BIT SEQUENCE THAT INCLUDES VOLTAGE AND TEMPERATURE INFORMATION IN A BATTERY MANAGEMENT SYSTEM

(75) Inventor: John Michael Ross, Olney, MD (US)

(73) Assignee: Texas Instruments Incorporated, Dallas, TX (US)

( * ) Notice: Subject to any disclaimer, the term of this patent is extended or adjusted under 35 U.S.C. 154(b) by 627 days.

(21) Appl. No.: 13/112,743

(22) Filed: May 20, 2011

(65) Prior Publication Data

US 2012/0297233 A1    Nov. 22, 2012

(51) Int. Cl.
  *G06F 1/04* (2006.01)
  *G06F 1/00* (2006.01)
  *H04N 21/236* (2011.01)

(52) U.S. Cl.
  CPC ............................... *H04N 21/23602* (2013.01)

(58) Field of Classification Search
  CPC .......................................................... G06F 1/04
  USPC .......................................... 713/501, 502, 600
  See application file for complete search history.

(56) References Cited

U.S. PATENT DOCUMENTS 6,970,525 B1 * 11/2005 Kljajic et al. ................. 375/354
7,826,578 B1   11/2010 Melanson et al.
2003/0084112 A1 * 5/2003 Curray et al. ................. 709/208
2004/0228430 A1 * 11/2004 Moy et al. ..................... 375/376

(Continued)

FOREIGN PATENT DOCUMENTS

EP    1933494    4/2010

OTHER PUBLICATIONS

PCT Search Report mailed Nov. 28, 2012.

(Continued)

*Primary Examiner* — Jaweed A Abbaszadeh
*Assistant Examiner* — Terrell Johnson
(74) *Attorney, Agent, or Firm* — William B. Kempler; Frank D. Cimino

(57) ABSTRACT

Systems and methods are disclosed which relate to improving synchronization of clocks between a sender and a receiver communicating via an asynchronous serial interface. In a ring topology, a master device is connected to a plurality of slaves communicating using a bi-frequency encoded bit stream. A host device communicates with the master device using a non-return-to-zero data encoding. Each slave receives data from the master and sends it to the next slave in the ring unaltered unless the master indicates a requirement for a particular data, and transmits placeholder bits with a value of 0 around the ring. A particular slave can "fill-in" the placeholder bits with the information to be sent back to the master by inverting the placeholder bit. Clock synchronization between a receiving device and a transmitting device is improved using a fractional rate multiplier to generate a data sampling clock from a system clock. By adjusting the denominator, the sampling clock can be tuned to match the baud rate of the asynchronous serial data stream received from the transmitting device. Embodiments described include power management, data acquisition (DAQ), etc.

18 Claims, 7 Drawing Sheets

(56) References Cited

U.S. PATENT DOCUMENTS

| | | | |
|---|---|---|---|
| 2005/0216631 A1* | 9/2005 | Daly et al. | 710/110 |
| 2006/0008040 A1 | 1/2006 | Vallet et al. | |
| 2006/0062327 A1 | 3/2006 | Dally | |
| 2009/0210596 A1* | 8/2009 | Furuya | 710/110 |

OTHER PUBLICATIONS

Linear Technology Corporation, "Multicell Battery Monitors," LTC6804-1/LTC6804-2, Milpitas, CA, 2013, www.linear.com/LTC6804-1.

* cited by examiner

METHOD AND SYSTEM FOR ASYNCHRONOUS SERIAL COMMUNICATION IN A RING NETWORK BY GENERATING AN OVERSAMPLING CLOCK USING A FRACTIONAL RATE MULTIPLIER AND SAMPLING A RECEIVED DATA BIT SEQUENCE THAT INCLUDES VOLTAGE AND TEMPERATURE INFORMATION IN A BATTERY MANAGEMENT SYSTEM

BACKGROUND OF THE INVENTION

1. Field of the Invention

The present invention relates to communication networks. In particular, the present invention relates to improving synchronization of elements within an asynchronous serial data network.

2. Background of the Invention

In data communications there are two distinct formats for data transfer:

serial and parallel. In serial data transfer, data is transferred one symbol at a time over a single communications channel or link, for example a wire, optical fiber, or wireless connection. In parallel data transfer, multiple symbols are transferred simultaneously over a corresponding multiple of channels. Data is typically represented in binary format and a symbol may encode 1 or more binary data bits such as a one (1) or zero (0).

One advantage of serial communication over parallel communication is that a serial interface requires fewer physical resources to implement, such as transmit and receive circuitry, printed circuit board area, integrated circuit pins, connectors and cables. In short, a serial interface is advantageous for implementing low-cost, compact and portable systems. For instance, some battery management systems include large numbers of serially connected lithium-ion battery cells. In these systems, hundreds of cells of 3-4 volts (V) may be connected in series to battery packs as high as 800V or more. These battery management systems are use in several applications, such as hybrid electric automobiles, buses, golf-carts, fork-lifts, power-boats, etc.

A universal asynchronous receiver and transmitter (UART) is one example of a device that implements a serial interface. The UART is ubiquitous in modern computing and communications and has a long history in the art. A standard implementation of a UART is found in RS-232 transceivers. The RS-232 specification dates back to the 1960s, when it was first released by the Electronic Industries Association (EIA). The specification has evolved over time, incorporating higher data rates and closing compatibility gaps. The current version of the RS-232 specification is ETA/TIA-232-F, dated October 1997. The protocol benefited from the availability of integrated circuits (IC) that include complexity to handle these communications at reasonable cost.

A UART comprises two serial channels, one for transmitting data and one for receiving data, operating in full-duplex. In the UART protocol data is transmitted in frames, one bit per symbol, where the data is represented in binary format using non-return to zero (NRZ) encoding. A typical UART frame includes a start bit, 8 data bits, and a stop bit. Other variants are possible (additional stop bits, fewer data bits, parity bits for rudimentary error detection, etc.). RS-232 bus drivers invert as well as level shift, so a logic 1 is a negative voltage on the bus, and a logic 0 is a positive voltage.

A UART is ordinarily constructed using clocked or synchronous logic. The term "asynchronous" arises because a clock signal is not transmitted as part of the interface protocol. In fact, the clocks of the transmitting and receiving UARTs may have differing phase and frequency. Therefore, when two UARTs communicate, both transmitter and receiver must agree on the symbol rate, also called the baud rate, in advance. The receiving UART recognizes the limits of a data frame by observing the start and stop bits, and determines the best data sampling point for each bit based on the predetermined baud rate.

UART receivers commonly synchronize themselves to data frames using an oversampling clock. For instance, a UART may use a sample clock that is 16 times the baud rate. A new frame is recognized by a falling edge at the beginning of a start bit. The UART resets a counter on this falling edge, and expects the middle of the start bit to occur after 8 clock cycles, and the mid point of each subsequent bit to appear every 16 clock cycles thereafter. The bits are sampled at each mid point. Another method involves sampling each bit not simply once at the mid point (cycle 8 out of 16) but also on the cycle before and after the mid point (cycles 7, 8 and 9 out of 16). A vote-of-three is applied to the samples, thereby avoiding a data error caused by noise corrupting any one sample.

The frequency stability of the transmitter and receiver clocks is a concern when attempting to transfer data correctly. If the receiving and transmitting UART clock frequencies are too far apart, data errors may occur. The timing of the data frame is based on the transmitting UART's clock. The receiving UART synchronizes to the frame based on detection of the start bit. As the remaining bits in the frame are sampled, any frequency mismatch between transmitter and receiver accumulates so that the sampling point of the bit deviates from the actual mid point. A data error is caused when this deviation exceeds the boundaries of the valid data window for the bit and the bit is sampled too early or too late. This can be compounded by the fact that the valid data window is reduced by finite (and typically slow) transmission rise and fall times such as those caused by a long, capacitive RS-232 bus, making it more important to sample close to the mid point where the level has settled. Clock frequency tolerances are generally described in terms of percentages. For instance, a frequency mismatch between transmitter and receiver in a normal scenario should not exceed approximately 3-4%; the exact tolerance dependent on the oversampling frequency and size of the valid data window for a bit. Exceeding this mismatch leads to a cumulative drift of the data sampling point after the initial synchronization with the start bit, and can result in sampling errors, such as sampling during the undefined region of the bit transition or even sampling the wrong bit.

Crystal oscillators have been used to match transmit and receive clocks, however, these are too expensive for cost-sensitive applications and can consume too much power for low-power applications. RC oscillators are an alternative commonly found in embedded circuits but they are sensitive to process, voltage, and temperature variations, i.e. the frequency changes as the conditions change. Compensating for these effects requires design of larger and higher current circuitry and time consuming device trimming, all of which is undesirable. For instance, in the battery management system described above, the volatile nature of lithium-ion battery cells requires careful monitoring of the voltage and temperature of the cells. Particularly during charge and discharge, monitoring and controlling avoids over-voltage (overcharge), under-voltage (over-discharge) and over and under temperature conditions. Special battery management integrated circuits (ICs) are developed to handle this job. These data acquisition devices contain inputs to monitor the cell voltage and temperature and circuitry to convert these quantities from analog to digital form. Because the voltage of each cell and temperature of each cell (or a small group of cells) must be monitored individually, it is impractical to build one device to monitor the hundreds of cells. The device would be too large (have too many pins) and the high voltages in the system prohibit constructing this device with commonly available silicon technologies. In addition, the physical dimensions of a battery pack are such that if all cells had to be wired back to a single device it would require long wires congested wiring.

UARTs may be designed to operate at a variety of baud rates. It is desirable to maintain the same number of samples per bit for each different baud rate in order to simplify the logic design and also provide a scaling of the immunity to sampled noise proportional to the baud rate. This is typically accomplished by providing a system clock to the UART with a frequency greater than the highest baud rate and using an integer divider to generate the desired sampling clock frequency. Table 1 illustrates this method for different baud rates assuming an 8.192 MHz system clock is used to generate a 16 times over-sampling clock. For a baud rate of 9600 bits per second, the ideal sampling clock would be 9600×16=153.6 kHz. However, using the integer divider the closest frequency that can be generated is 154.566 kHz. This represents an error of 0.629%, which is acceptable for reliable data transmission.

TABLE 1

| BAUD[1:0] | Baud Rate | N | Sample Clock | Sample Clock error | Centering error |
|---|---|---|---|---|---|
| 0 0 | 9600 bps | 53 | 154.566 KHz | 0.629% | −5.93% |
| 0 1 | 19200 bps | 27 | 303.407 kHz | −1.235% | 11.88% |
| 1 0 | 38400 bps | 13 | 630.154 kHz | 2.56% | −23.8% |
| 1 1 | 76800 bps | 7 | 1170.285 kHz | 4.76% | −47.5% |

Further examination of Table 1 shows that the sampling clock error increases as the baud rate increases. Although the error for 38400 bps (2.56%) is marginally acceptable, the error for 76800 bps is clearly unacceptable and will result in data sampling errors. Further this error does not account for additional drift of the system clock due to temperature variations, etc. Nor does it account for any error of the clock in the transmitter.

One method that may be used to mitigate the effects of clock mismatch in asynchronous serial communications involves alternative signaling schemes, such as continuous bi-frequency encoding rather than NRZ encoding. Unlike NRZ encoding, continuous bi-frequency encoding provides a signal transition at the start of every bit. A zero and one data bit are distinguished by the absence or presence of a second transition midway through the bit time. For example, a zero is characterized by a single transition at the start of the bit time and no additional transitions for the remainder of the bit time. In contrast, a one is characterized by a first transition at the start of the bit time and a second transition midway through the bit time.

Continuous bi-frequency encoding is tolerant of greater clock frequency mismatch because the receiving device can synchronize to the start of each bit rather than only the start bit. In fact, the start and stop bits in the traditional UART protocol are no longer necessary. Because each bit is synchronized, the error does not accumulate as each subsequent bit is received and clock frequency mismatches greater than 20% can be tolerated when using 16 times oversampling. However, although the tolerance is improved, further improvement is still desirable.

Asynchronous serial interfaces are commonly used to connect nodes in various network topologies such as a ring network. A ring network is a network topology in which the nodes are connected in a closed loop. Each node is connected to exactly two other nodes such that starting at any particular node, traversing a path through all other nodes will lead back to the starting node. Each node is a connection point that represents a system or device, and the devices in the ring communicate with each other through the connections between the nodes. Intermediate nodes are able to pass data between their adjacent nodes such that non-adjacent nodes can communicate with one another around the ring. The communication circuits in different nodes of the network do not normally share a common clock, i.e. they are unsynchronized.

Therefore, there is a need for an improved system and method for serial communication between devices to overcome the problems of unsynchronized clocks, and which can be applied in a communications network of various topologies such as a ring network.

SUMMARY OF THE INVENTION

The present invention solves the above problems by providing a system and method for improving the allowed frequency tolerance of clocks between transmitting and receiving devices communicating over an asynchronous serial interface, and further enables these improvements in network topologies such as a ring network.

Briefly described, one embodiment of the system comprises a sending and a receiving device which communicate over an asynchronous serial interface, where the sending device transmits a predetermined bit-sequence. The receiving device counts a number of system clock cycles during the predetermined bit-sequence, and using a fractional multiplier generates an oversampling clock proportional to the baud rate of the received data, which is used to sample additional received data. The oversampling clock frequency is equal to the system clock frequency multiplied by a fraction with a fixed numerator and a variable denominator, the denominator equal to the number of system clock cycles counted during the predetermined bit-sequence.

The sending and receiving devices in the system may communicate using a UART protocol with non-return-to-zero (NRZ) data encoding, in which case the predetermined bit-sequence is a number of alternating '1' and '0' bits. Alternatively, the sending and receiving devices may communicate using continuous bi-frequency encoded data, in which case the predetermined bit-sequence is number of consecutive '0' bits.

Further, in the case of using bi-frequency encoded data, a plurality of devices may be connected in a ring network topology, where one device is the sending device designated as the master, and the remaining devices are receiving devices designated as slaves. The master transmits the predetermined bit-sequence which is received by each slave, each slave synchronizing its oversampling clock to the baud rate of the received data. When data is being transmitted from the master to one or more slaves, each slave receives the data and sends it to the next slave in the ring unaltered. When the master wishes to receive data back from a slave, the master transmits placeholder bits with a value of '0' around the ring. A particular slave can "fill-in" the placeholder bits with the information to be sent to the master by passing the data unaltered to send a '0', or inverting the data midway through the predefined bit time to send a '1'. The master reads this information when the data bits are returned from the last slave device in the ring. In a battery management system, the information may be communicated back to a central controller that interprets the voltage and temperature information to determine if an unsafe condition has occurred at one or more of the cells. The central controller (host) can then take appropriate action such as alerting an operator of the system, opening a circuit breaker to discontinue charge and/or discharge of the cells or take some other action to mitigate the unsafe condition. In addition, the master device may contain a certain amount of its own intelligence such as the ability to detect the over or under voltage or temperature condition, or may have additional operational modes such as the ability to control cell voltage or charge balancing. Bidirectional communication ensures that the host controller can configure the modes and functions of the data acquisition devices and subsequently read back status and measurement information. This is typically done by using a serially connected (or daisy-chained) communications interface.

In another exemplary embodiment, the present invention is a method for improved asynchronous serial communication, the method including receiving a predetermined bit sequence from a transmitter, monitoring a difference between a system clock and transmitting baud rate by counting a number of system clock cycles over the predetermined bit sequence, generating an oversampling clock using a fractional rate multiplier having a fixed numerator and a variable denominator, the denominator being equal to the counted number of system clock cycles, the oversampling clock being generated by multiplying the system clock by the ratio of the numerator to the denominator, and sampling a data bit sequence from the transmitter using the oversampling clock.

Further, the method may include receiving bi-frequency encoded data from a master, the data including placeholder bits with a value of '0', and sending data back to the master by "filling-in" the placeholder bits, where the data is passed unaltered to send a '0', and the data is inverted midway through the bit time to send a '1'.

The present invention is simple and scalable over a wide range of baud rates and tuning ranges. Power consumption and immunity to sampled noise scale with the oversampling clock frequency, and therefore the baud rate, while maintaining identical operation and performance. In addition, the present invention reduces the need for closely matched clocks between sending and receiving devices. Other systems, methods, features and advantages of the present invention will be apparent to one skilled in the art upon examination of the following drawings and detailed description.

DETAILED DESCRIPTION OF THE INVENTION

Figure 1A:
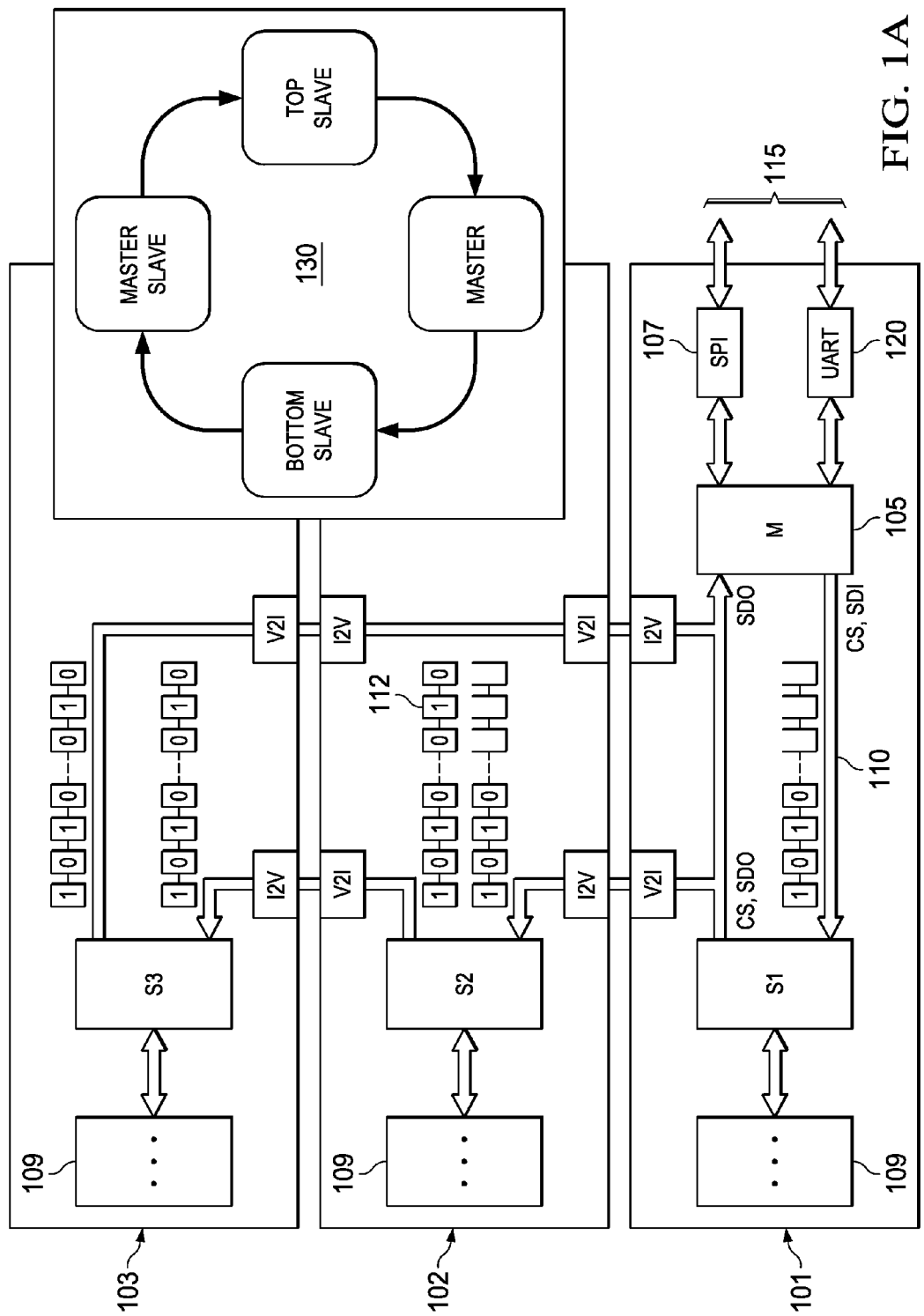
FIG. 1A shows a system for serial communication in a ring network, according to an exemplary embodiment of the present invention.

The present invention presents a novel technique for improving serial communications between devices. A plurality of devices is connected in a ring network. One device is defined as a master device and the remaining devices are defined as slave devices. The master device communicates with any slave in the ring using a continuous bi-frequency encoded bit stream. Serial data transmitted by the master device travels around the ring to each slave and then returns to the master. The start of each bit is signaled by the master inverting the state of the line connected to the first slave in the ring. The master can signal a '1' bit by inverting the line a second time midway through a predefined bit-time. Otherwise, the bit is interpreted as a '0'. When data is being transmitted from the master to one or more slaves, each slave receives the data and sends it to the next slave in the ring unaltered. When the master wishes to receive data back from a slave, the master transmits placeholder bits with a value of '0' around the ring. A particular slave can "fill-in" the placeholder bits with the information to be sent to the master by passing the data unaltered to send a '0', or inverting the data midway through the predefined bit time to send a '1'. The master reads this information when the data bits are returned from the last slave device in the ring. Further, the master device contains a UART interface for communicating with an external host device. Whereas data within the ring network is transmitted via continuous bi-frequency encoding, data transmitted and received at the UART is NRZ encoded and includes start and stop framing bits.

Data is transmitted at a particular baud rate which is based on the frequency of a local system clock in the transmitting device. The receiving device must synchronize to the transmitted baud rate in order to properly sample the received data. Ideally, the oversampling clock in the receiving device would be an exact integer multiple of the baud rate, for example 16 times the frequency of the baud rate. However, differences in frequency between the local system clocks in the transmitting and receiving devices, caused by inherent limits in the oscillator accuracy and drift due to changing environmental conditions such as temperature, prevent the oversampling clock from being an exact multiple of the baud rate so that synchronization differences can lead to sampling errors and the data transmission fails. To solve this problem, devices in the ring are equipped with logic to improve clock synchronization between the transmitting device and the receiving device, that is, from the master device to a slave device as well as from the external host device to the master device. A fractional rate multiplier is used in the receiving device to generate a data oversampling clock from a local system clock. The fraction is stored as two values, a numerator and a denominator. The oversampling clock frequency is equal to the system clock frequency multiplied by the ratio of the numerator to the denominator. Fractional rate multipliers are known in the art and can be implemented in a number of ways for example using an M/N integer PLL. By holding the numerator constant and adjusting only the denominator, the oversampling clock can be tuned to match a constant multiple of the baud rate of the asynchronous serial data stream received from the transmitting device. The oversampling clock is then used as normal to sample serial data received following the predetermined bit-sequence.

The denominator is automatically determined by counting the number of system clock cycles in a predetermined bit-sequence. Prior to synchronization, the bit-sequence can be identified by detecting transitions in the sequence by sampling the serial data with the system clock. For NRZ encoding, the predetermined bit-sequence is a predetermined number of alternating '1' and '0' bits, resulting in one transition per bit. For continuous bi-frequency encoding, the predetermined bit-sequence is a number of '0' bits, also resulting in one transition per bit. For example, the predetermined bit-sequence for the NRZ case can be a single frame with a start bit ('0'), eight alternating data bits ('10101010') and a stop bit ('1'), where the number of system clock cycles is counted over the eight data bits delimited by the rising edge of the first bit and the rising edge of the stop bit. For continuous bi-frequency encoding, an example of a predetermined bit sequence is an even number of zeros, such as '000000', where the number of system clock cycles is counted over an even number of bits delimited by the rising/falling edge of the first bit and the rising/falling edge of the next bit following the last zero. The system clock is counted over an even number of bits in order to have an equal number of high and low pulses, thus averaging out any differences in the high and low pulse widths caused by finite and different rise and fall times. The resulting count is used directly as the value of the denominator. The tuning resolution and range are limited only by the size of the numerator and denominator.

The solution is simple and scalable over a wide range of baud rates and tuning ranges. Power consumption and immunity to sampled noise scale with the oversampling clock frequency, and therefore the baud rate, while maintaining identical operation and performance.

As used herein and throughout this disclosure, the term universal asynchronous receiver/transmitter (UART) is any piece of computer hardware or software that implements an asynchronous serial interface. UARTs are commonly used in conjunction with other communication standards such as EIA RS-232. A UART may be part of an integrated circuit used for serial communications over a computer or peripheral device serial port. UARTs are commonly included in microcontrollers. A dual UART, or DUART, combines two UARTs into a single chip. A transmitting UART takes bytes of data and transmits the individual bits in a sequential fashion. A receiving UART re-assembles the bits into complete bytes.

The bits are transmitted on a signal wire. Signals may be of many different forms. Examples of standards for voltage signaling are RS-232, RS-422 and RS-485 from the EIA. Some signaling schemes do not use electrical wires. Examples of such are optical fiber, IrDA (infrared), and (wireless) Bluetooth in its Serial Port Profile (SPP). Some signaling schemes use modulation of a carrier signal (with or without wires). Examples are modulation of audio signals with phone line modems, RF modulation with data radios, and the DC-LIN for power line communication. Serial communication may be "full duplex" (both send and receive at the same time) or "half duplex" (devices take turns transmitting and receiving).

UARTs, masters, slaves, hosts, and other devices may have a processor, a memory, a transceiver, an input, and an output. The memory stores applications, software, or logic. Examples of processors are computer processors (processing units), microprocessors, digital signal processors, controllers and microcontrollers, etc. Examples of memories that may store logic include RAM (random access memory), flash memories, ROMS (read-only memories), EPROMS (erasable programmable read-only memories), and EEPROMS (electrically erasable programmable read-only memories).

"Logic" as used herein and throughout this disclosure, refers to any information having the form of instruction signals and/or data that may be applied to enable a processor to manipulate and transmit other data and information. Logic may be formed from signals stored in a memory. Software is one example of such logic. Logic may also be comprised by digital and/or analog hardware circuits, for example, hardware circuits comprising logical AND, OR, XOR, NAND, NOR, and other logical operations. Logic may be asynchronous or synchronous, meaning that its operation is synchronized to a clock. Logic may be combinational or sequential. In sequential logic, the state of a system is maintained in one or more storage elements. Logic may be formed from combinations of software and hardware. On a network, logic may be programmed on a server, or a complex of servers. A particular logic unit is not limited to a single logical location, unit, or device.

For the following description, it can be assumed that most correspondingly labeled structures across the figures (e.g., 132 and 232, etc.) possess the same characteristics and are subject to the same structure and function. If there is a difference between correspondingly labeled elements that is not pointed out, and this difference results in a non-corresponding structure or function of an element for a particular embodiment, then that conflicting description given for that particular embodiment shall govern.

FIG. 1 shows a system for serial communication in a ring network, according to an exemplary embodiment of the present invention. Devices 101, 102 and 103 are arranged in a vertical interface stack, and communicate with each other via an asynchronous serial interface bus. Each of devices 101, 102, and 103 has a corresponding slave unit S1, S2, and S3. Slaves S1-S3 contain logic that enables them to detect a predetermined bit sequence and synchronize their oversampling clocks to the baud rate of a received bit stream. Bottom device 101 has a bottom slave S1, as well as a master unit 105. Master unit 105 commands slaves S1-S3, and also communicates with interfaces 120 and 107. Interface 107 is a SPI interface, and interface 120 is a UART. UART 120 contains logic that enables it to detect a predetermined bit sequence and synchronize an oversampling clock to the baud rate of a received bit stream. Either or both of interfaces 120 and 107 connect to a host device 115. One function of UART 120 is to convert data/instructions from host 115 to master 105, to be propagated throughout the ring. Each device 101-103 in the ring includes other functions 109 that communicate with the respective slaves, such as battery management, data acquisition (DAQ), etc. Other functions 109 could be those of data storage, power supply, microcontroller, etc.

Data stream 110 sent by master 105 travels around the ring to each slave and then returns to the master 105. When master 105 sends information to devices 101-103, each slave S1-S3 receives the data and sends it to the next slave in the ring. The last slave in the ring (top slave S3 in device 103) sends the data back to the master through devices 101-103, thus forming a logical ring. The logical flow of the ring is represented by box 130. The data stream 110 is continuous bi-frequency encoded. The start of each bit is signaled by the master inverting the state of the line connected to the first slave in the ring. The master can signal a '1' bit by inverting the line a second time midway through a predefined bit-time. Otherwise, the bit is interpreted as a '0'. When data is being transmitted from the master to one or more slaves, each slave receives the data and sends it to the next slave in the ring unaltered.

Each device 101-103 in the ring is assigned a unique address. The bit stream 110 comprises information identifying a destination slave address and an instruction to be executed by the device. The slave contains logic to receive the bit stream, parse the data, and determine whether or not the instruction is directed to that slave. When the master wishes to receive data back from a slave, the bit stream 110 comprises a destination slave address and an instruction identifying the requested data, followed by placeholder bits with a value of '0'. Data is sent back to the master by altering the placeholder bits in bit stream 110. To send a '0', the addressed slave passes the placeholder bit to the next device in the ring unaltered. To send a '1' to the master, the slave inverts the line connected to the next device in the ring midway through the bit-time. In this manner, a particular slave can "fill-in" the placeholder bits with the information to be sent back to master 105. Master 105 reads this information when the data bits are returned from top slave device 103. Only one slave 101-103 alters any given placeholder bit. An exclusive-OR (X-OR) function is used by each slave in the signal path to invert the state of the line.

This configuration maintains the continuity of the bi-frequency encoding scheme even though the lines connecting each device in the ring may be in differing states. Continuous bi-frequency encoding does not require framed bit sequences; instead a single transition or "edge" defines the start of a bit time. This enables a per-bit synchronization that provides higher clock tolerance than synchronizing merely at a start bit of every byte. This works well for compatibility with other interfaces that do not use framing bits, for instance a Serial Peripheral Interface (SPI). The ring topology has the advantage of being tolerant to the propagation delay through each device, as well as providing feedback to the master regarding the integrity of the ring. The invention enables the combination of these advantages while minimizing the latency occurring by unnecessary processing at the slaves.

Figure 1B:
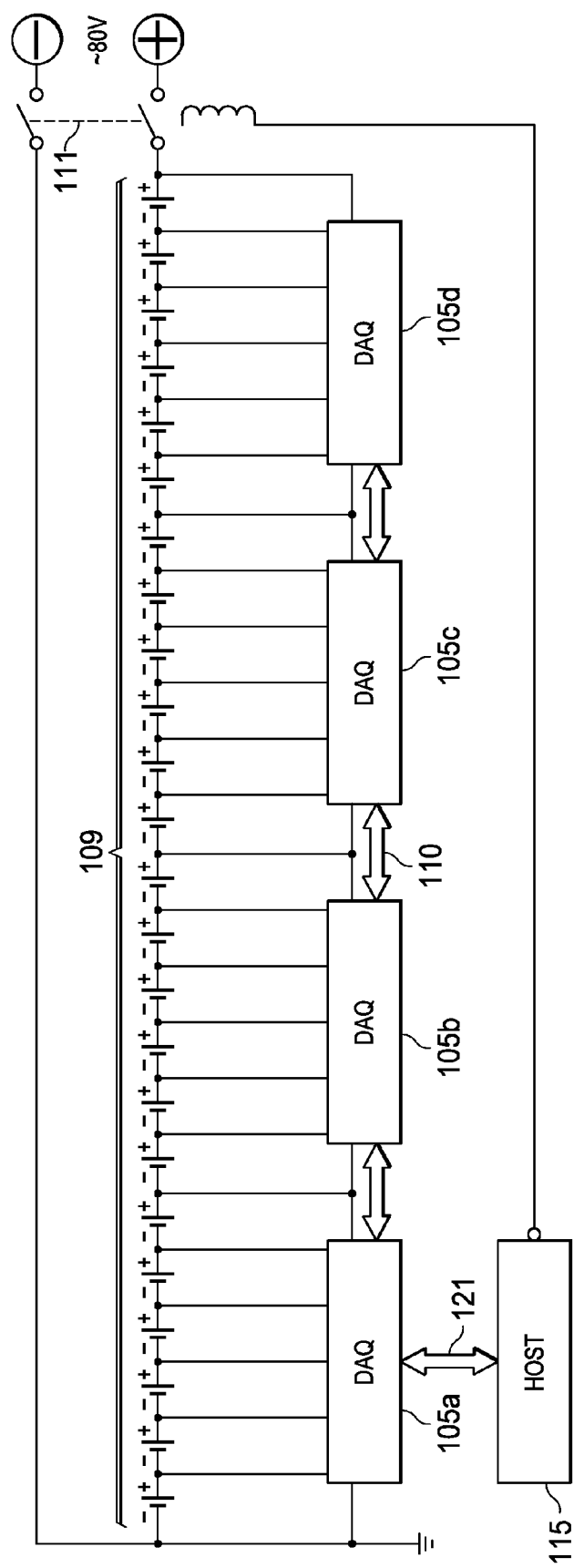
FIG. 1B shows a battery management system, according to an exemplary embodiment of the present invention.

FIG. 1B shows a more specific application of the above exemplary embodiment being used in a battery management system. A battery management system would use each device 101-103 to monitor 6 to 12 cells at a time, and would communicate serially in a similar manner as the cells themselves, resulting in devices connected in series for monitoring multiple series-connected lithium cells. The information obtained by these data acquisition devices would be communicated back to a central controller (host device 115) that interprets the voltage and temperature information to determine if an unsafe condition has occurred at one or more of the cells.

In this embodiment, an array of cells 109 is serially connected to each other to form a system that could, for instance, constitute a portion of devices 101-103 of FIG. 1A. In this case, management of the cells is the additional function 109. Digital acquisition (DAQ) devices 105a, 105b, 105c, and 105d are further serially connected to each other, and have interfaces to communicate with a plurality of the array of cells 109. In the embodiment shown, DAQ devices 105a-105d communicate with 5 cells each, however, other configurations are possible depending upon the scope of the system. DAQ devices 105a-105d are arranged in a stack, and communicate with each other via an asynchronous serial interface bus. DAQ devices 105b-105d include logic that enables them to detect a predetermined bit sequence and synchronize their oversampling clocks to the baud rate of a received bit stream from DAQ device 105a. DAQ device 105a can thus be considered a master within the context of FIG. 1A, and therefore commands DAQ devices 105b-105d to measure power levels, voltage, temperature, etc. of their portion of cells 109.

DAQ device 105a further communicates with and receives commands from host 115 via host serial communication bus 121. DAQ 105a may further contain UART logic enabling it to detect a predetermined bit sequence and synchronize an oversampling clock to the baud rate of a received bit stream from host 115, as well as to convert data/instructions from host 115 to all DAQ devices 105a-105b, to be propagated throughout the stack. A data stream transmitted by DAQ 105a propagates through the system to each DAQ device and is then returned, as described above with respect to FIG. 1A. The bit stream includes placeholder bits for values representing a power level, status, etc. of the corresponding portion of cells 109. The information is communicated back to host 115 that interprets the voltage and temperature information to determine if an unsafe condition has occurred at one or more of the cells. Host 115 can then take appropriate action such as alerting an operator of the system, opening a circuit breaker to discontinue charge and/or discharge of cells 109, or take some other action to mitigate the unsafe condition. In addition, DAQs 105a-105d may contain a certain amount of their own intelligence such as the ability to detect the over or under voltage or temperature condition, or may have additional operational modes such as the ability to control cell voltage or charge balancing. Bidirectional communication ensures that the host controller can configure the modes and functions of the data acquisition devices and subsequently read back status and measurement information.

Figure 2:
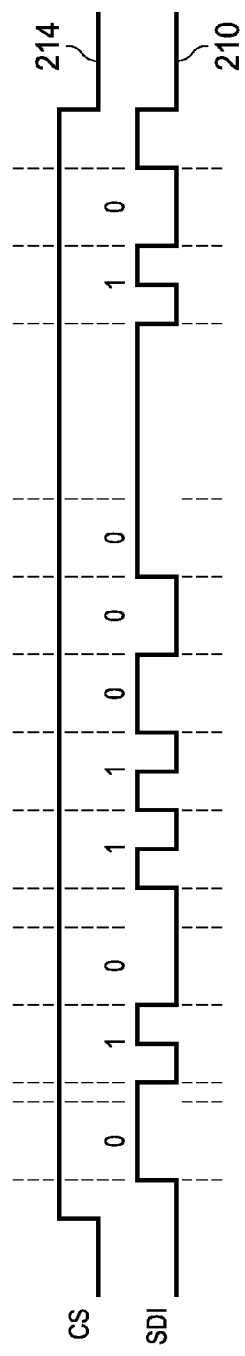
FIG. 2 shows a bi-frequency encoded bit stream, according to an exemplary embodiment of the present invention.

FIG. 2 shows a bi-frequency encoded bit stream 210, according to an exemplary embodiment of the present invention. A receiving device monitors the serial data stream, or bit sequence, 210 by sampling with an oversampling clock, for instance 16 times the bit rate, in order to detect changes on the line. Each bit is contained within a bit time. A change on data line 210 counts as an edge, and upon detecting this, a count is initiated for the number of oversampling clock cycles equal to the bit time, for example 16 cycles for a 16 times oversampling rate If, during the count, no other transitions appear, it is treated as a 0. If, during the count, another edge appears, it is treated as a 1.

Figure 3:
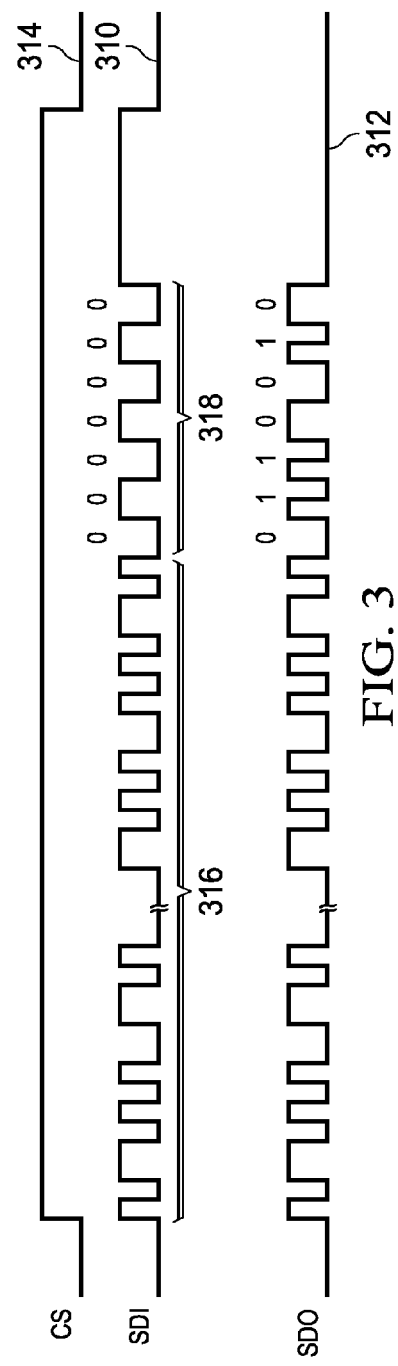
FIG. 3 shows a read-back data in a bit stream, according to an exemplary embodiment of the present invention.

FIG. 3 shows read-back data in a bit stream, according to an exemplary embodiment of the present invention. Serial bit stream 310 is transmitted by the master in a continuous bi-frequency encoded format and represents the data received by a slave. Bit stream 310 includes a first section 314 which is sent at the beginning of the bit stream and comprises an even number of zeros used for synchronizing the receiving slave (S1-S3) oversampling clock to the transmitted baud rate. For the slave to send data back, the master sends a series of "empty", or zero value bit slots, shown in section 318 of bit sequence 310. Section 316 of serial bit stream 310 includes a destination slave address and an instruction identifying the requested data.

Serial bit stream 312 represents a bit stream altered by the slave in order to send data back to the master. An "empty" bit slot 318 is equivalent to '0' (a single edge per bit time). The slave sees the '0', and modifies the empty bit slot to send data back, as shown in serial data out 312. The slave leaves the bit slot empty to indicate a '0'. The slave inverts the middle of the empty bit slot to add an edge, to represent a '1'. As the slave passes the bit stream to the next device in the ring the only delay is a propagation delay. The slave analyzes the bit stream in real time and does not add any clock cycle delays. This ensures that the slaves add minimal latency to the ring, enabling large stacks of slaves consisting of a large number of devices while accumulating minimum delay.

Figure 4:
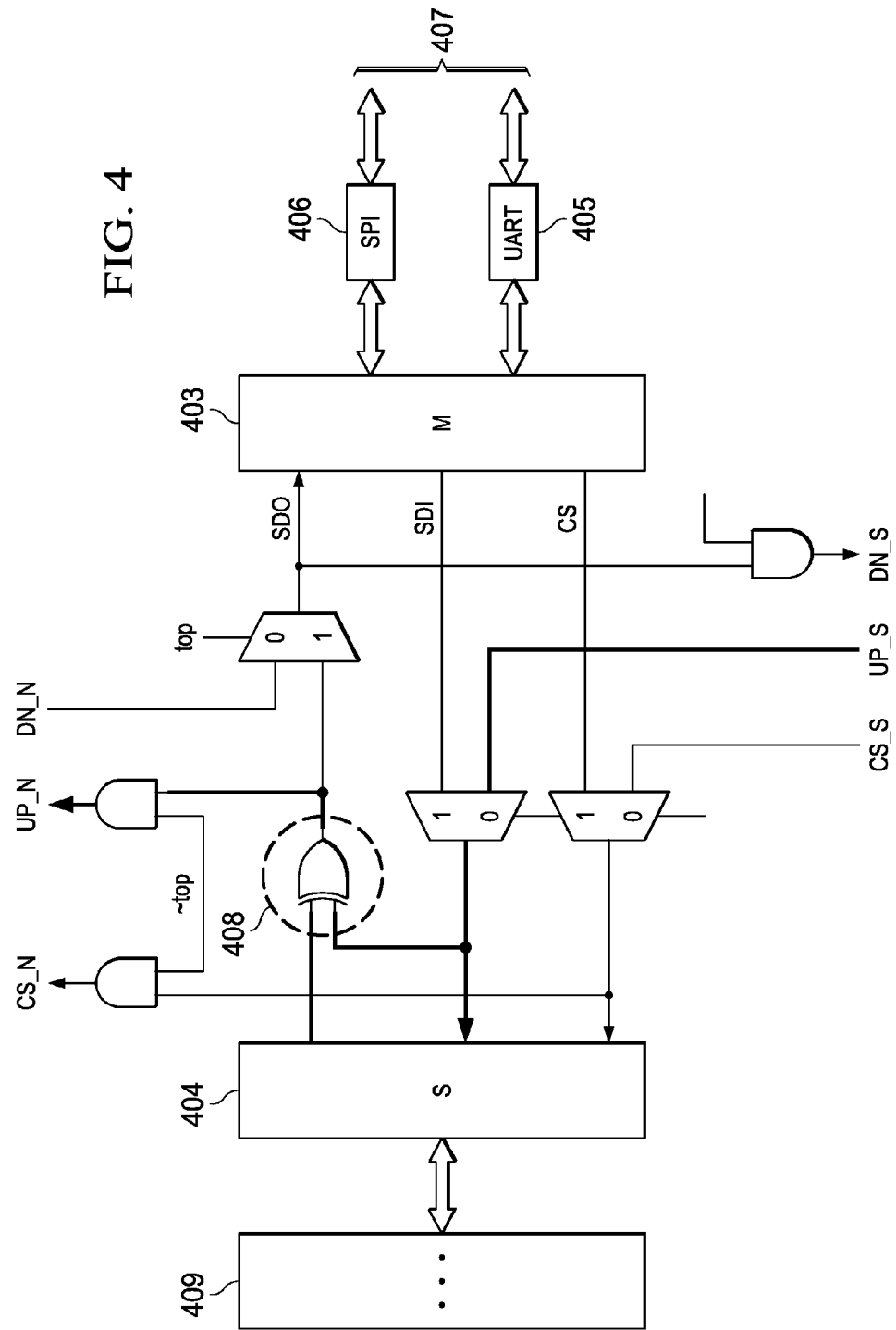
FIG. 4 shows a system including a data inverter, according to an exemplary embodiment of the present invention.

FIG. 4 shows a system including an inverting function, according to an exemplary embodiment of the present invention. The system illustrated in FIG. 4 is part of a generic device such as, for instance, devices 101-103 in FIG. 1. Steering logic is provided to configure the device for operation as a bottom, middle or top device. When configured as the bottom device 101 in the stack, UART 405 and SPI 406 provide an interface between a host 407 and a master device 403. Master 403 communicates with slave 404 using a continuous bi-frequency encoded bit stream via serial interface SDI by selecting the "1" input of multiplexer 410. The bit stream transmitted over SDI is combined with signal 416 in the exclusive-OR (X-OR) function 408. To pass the bit stream unaltered, slave 404 leaves the signal 416 unchanged. When the slave 404 is addressed and instructed by the master 403 to send data back to the master, the slave monitors the bit stream received over SDI and identifies the edge that delimits the start of each placeholder bit. To "fill-in" the placeholder bit with a '0' value, the slave 404 allows the placeholder bit to pass unaltered. To "fill-in" the placeholder bit with a '1' value, following detection of the edge delimiting the start of the placeholder bit, the slave 404 waits a time equal to one half the bit time and then changes the state of signal 416 to it's opposite state. Continuous bi-frequency encoded signaling is only dependent on transitions in the bit stream. It does not depend on the level ('0' or '1') nor does it depend on whether the edge is rising or falling. Because of this, the initial state of signal 416 may be either a '1' or '0'. The only requirement is that signal 416 remain constant except when changing state in the middle of a bit time when filling in a placeholder bit with a '1' value. The bit stream is passed to the next device in the ring by setting the "~top" signal into AND function 414 to a logical '1'. Conversely, the "top" signal controlling multiplexer 412 is set to '0' in order for the master to receive the returning bit stream from the last device in the ring over SDO.

When configured as a middle device in the stack, the slave 404 receives the serial bit stream over interface UP_S by selecting the "0" input of multiplexer 410. The bit stream is passed in the return path to the master device from the serial interface DN_N to DN_S by setting the "top" signal controlling multiplexer 412 to '0' and signal 418 into AND function 420 equal to '1'. The operation of slave 404 in the middle device is identical to the operation described in the bottom device.

When configured as a top device in the stack, the slave 404 receives the serial bit stream over interface UP_S in the same manner as described for the middle device. However, rather than passing the bit stream through the UP_N interface, the bit stream is looped back for return to the master through the DN_S interface by setting the "top" signal controlling multiplexer 412 to '1' and signal 418 into AND function 420 equal to '1'. The operation of slave 404 in the top device is identical to the operation described in the bottom and middle devices.

Figure 5:
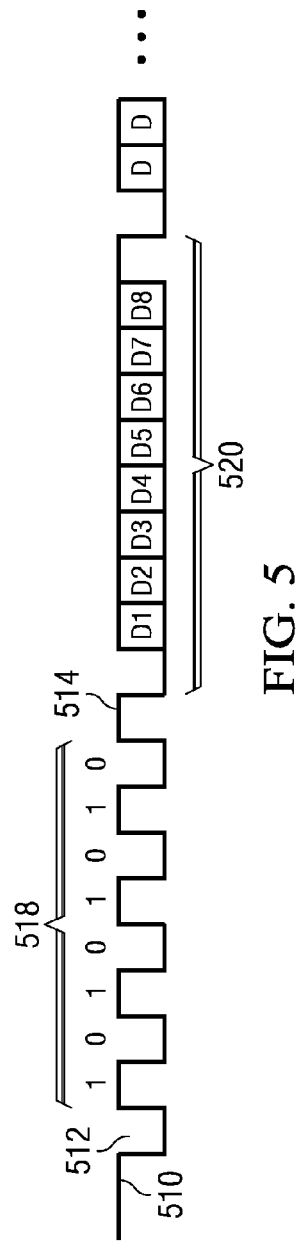
FIG. 5 shows a UART serial bit stream encoded in NRZ format, according to an exemplary embodiment of the present invention.

FIG. 5 shows a UART serial bit stream encoded in NRZ format, according to an exemplary embodiment of the present invention. Bit stream 510 illustrates a representative data frame 520 according to a UART protocol. The data frame begins with a start bit 512 equal to a logical '0' value, followed by eight data bits D1-D8 and is terminated by a stop bit 514 equal to a logical '1' value. Variations on this data frame are known in the art such as the addition of a second stop bit, a data length of seven bits, and the inclusion of a parity bit before the stop bit. Prior to the data frame a predetermined bit sequence is provided to allow a receiving device to synchronize an oversampling clock to the baud rate of the bit stream. The predetermined bit sequence comprises a start bit 512, followed by eight data bits 518 alternating between '1' and '0' and terminated by a stop bit 514. This particular predetermined bit sequence is chosen for its similarity to a normal data frame 520 such that a transmitting device with no knowledge of the synchronizing mechanism could generate the sequence. However, other predetermined bit sequence are possible, the only requirement being that the receiving device can detect boundaries in the bit stream that delimit a known number of bit times. The predetermined bit sequence is generated by a host device such as devices 115 and 407 in the systems illustrated in FIG. 1 and FIG. 4.

Figure 6:
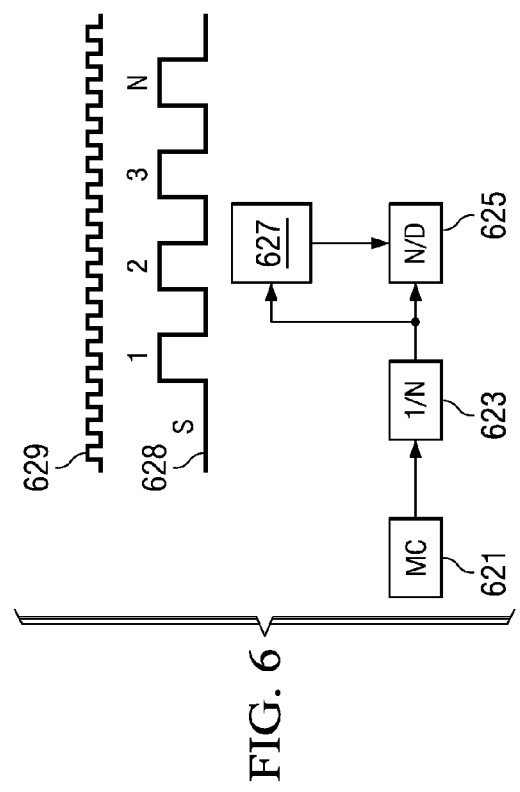
FIG. 6 shows the generation of an oversampling clock, according to an exemplary embodiment of the present invention.

FIG. 6 shows a system for synchronizing an oversampling clock to the baud rate of a received bit stream, according to an exemplary embodiment of the present invention. A system clock 624 is generated from a master clock 621. The system clock may be set equal to the master clock. Alternatively, the system clock may be generated by using a pre-scaling integer divider 623, where the system clock frequency is equal to the frequency of the master clock divided by integer M. The system clock is used to sample a predetermined bit sequence such as 314 shown in FIGS. 3 and 518 shown in FIG. 5. It is noteworthy that the predetermined bit sequences 314 and 518 are essentially identical even though sequence 314 is encoded in continuous bi-frequency format and represents a number of consecutive '0' values, and sequence 518 is encoded in NRZ format and represents a number of alternating '1' and '0' values. Therefore the same system for oversampling clock synchronization may be applied to both.

A receiving device 627 receives the predetermined bit sequence as part of a serial bit stream 628 and samples it at intervals determined by the system clock 624. The receiving device detects the transitions in the bit stream and identifies the extent of the predetermined bit sequence. For example, considering bit stream 510 in FIG. 5, the receiving device detects the transition from high to low at the leading edge of start bit 512. The receiving device then detects a sequence of 9 edges starting with the rising edge of the first data bit and ending with the rising edge of the stop bit 514 and counts the number of system clock cycles occurring over the interval. An even number of bits is chosen in order to have an equal number of high and low pulses, thus averaging out any differences in the high and low pulse widths caused by finite and different rise and fall times. An odd number of bits could also be used but may not be as accurate if the rise and fall times differ significantly.

Following the predetermined bit sequence, receiving device 627 samples the received bit stream 628 using an oversampling clock. In order to maintain synchronization to the bit stream, the number of samples per bit must be a known constant, for example 16. Furthermore, it is desirable to maintain the same number of samples per bit for different baud rates in order to simplify the logic design and also provide a scaling of the immunity to sampled noise proportional to the baud rate. This object is accomplished by fractional multiplier 625, which generates an oversampling clock with a frequency equal to the frequency of the system clock multiplied by a ratio of a fixed numerator N to an adjustable denominator D. The denominator is set equal to the count of system clock cycles over the predetermined bit sequence.

As an illustration of the effectiveness of the system, consider a case where the baud rate of the received bit stream 628 is known and constant, the receiving device has a master clock 621 of 8.192 MHz, the fractional multiplier 625 is set to a fixed value of 0.6 and an oversampling factor of 16 is desired. TABLE 2 shows how this is achieved for a variety of baud rates. For example, in the case of a 9600 bit-per-second serial bit stream, the master clock is pre-scaled using integer divider 623, where M is set to 32, thereby generating a system clock 624 of 256 kHz. The fractional multiplier 625 multiplies the system clock by 0.6, resulting in a sampling clock 626 of 153.6 kHz, which is exactly 16 times the baud rate of 9600 bits-per-second. Similarly, an oversampling clock of exactly 16 times the baud rate is achieved for the remaining baud rates in the table by changing the pre-scaling factor M to 16, 8 and 4 for the baud rates 19200, 38400 and 76800 bits-per-second, respectively.

TABLE 2

| BAUD[1:0] | Baud Rate | Sys Clock | Avg Sample Clock | Centering error |
|---|---|---|---|---|
| 0 0 | 9600 bps | 256 kHz | 153.6 kHz | +/−1.25% |
| 0 1 | 19200 bps | 512 kHz | 307.2 kHz | +/−1.25% |
| 1 0 | 38400 bps | 1.024 MHz | 614.4 kHz | +/−1.25% |
| 1 1 | 76800 bps | 2.048 MHz | 1.2288 MHz | +/−1.25% |

This is a vast improvement over simply using an integer divider as in TABLE 1; however this example is not likely to occur in actual practice. The baud rate of the received bit stream is not likely to be exact and may drift with changing temperature and other factors such as aging of the transmitting circuitry. Furthermore, the master clock of the receiving device may not be exactly 8.192 MHz and also may drift with changing temperature and aging of the clock generating circuitry.

To illustrate how the system of FIG. 6 can overcome this problem, consider the case where the baud rate of the received bit stream 628 is 10000 bits-per-second, the master clock 621 is 8.0 MHz and the integer divider 623 has a fixed factor M of 32 so that the system clock frequency is 8.0 MHz divided by 32 which is equal to 250.0 kHz. If the fractional multiplier 625 is fixed at 0.6, this will result in an oversampling clock frequency of 150.0 kHz. The desired 16 times oversampling rate for the 10000 bit-per-second baud rate is 160 kHz. Therefore with a fixed multiplication factor of 0.6 in fractional multiplier 625, the sampling frequency error is (160 kHz−150 kHz)/160 kHz=6.25% which will cause sampling errors in the case of the UART bit stream.

This problem is overcome by letting the numerator N of fractional multiplier 626 be a fixed value, for example 128, and letting the denominator D be a variable 8-bit value ranging from 0-255. At 10000 bits-per-second the 8-bit predetermined bit sequence will occur over a time period of 800 μs (micro-seconds). The system clock period is the inverse of the frequency, which for this example would be 1/250.0 kHz=4 μs. Therefore, the count of system clock periods over the predetermined bit sequence will be 200. Using this value as the denominator D in the fractional multiplier 625 results in a factor of 128/200=0.64. When this factor is multiplied by system clock 624, the resulting oversampling frequency is 250.0 kHz×0.64=160.0 kHz which is exactly 16 times the baud rate of the received bit stream and results in no sampling errors.

Assuming a nominal fractional multiplication factor of 0.6, using 128 over a denominator of 8 bits allows the receiving oversampling clock to be tuned greater than +/−20%. The nominal multiplication factor of 0.6 is achieved when the denominator D=213. Larger denominators can be used to adjust over a wider tuning range. The length of the predetermined bit sequence is based on the baud rate of the received bit stream, which is based on a system clock in a transmitting device, and the number of system clocks counted over the predetermined bit sequence is based on the receiving device's clock. If the system clock in the transmitting device is going slower than the system clock in the receiving device, the receiving device counts more cycles, and if the system clock in the transmitting device is faster than the system clock in the receiving device, then the receiving device counts fewer cycles over the predetermined bit sequence. In other words, as the transmitted baud rate decreases, the denominator gets larger, and the oversampling clock gets commensurately slower. Likewise, as the transmitted baud rate increases, the denominator gets smaller, and the oversampling clock gets commensurately faster.

Figure 7:
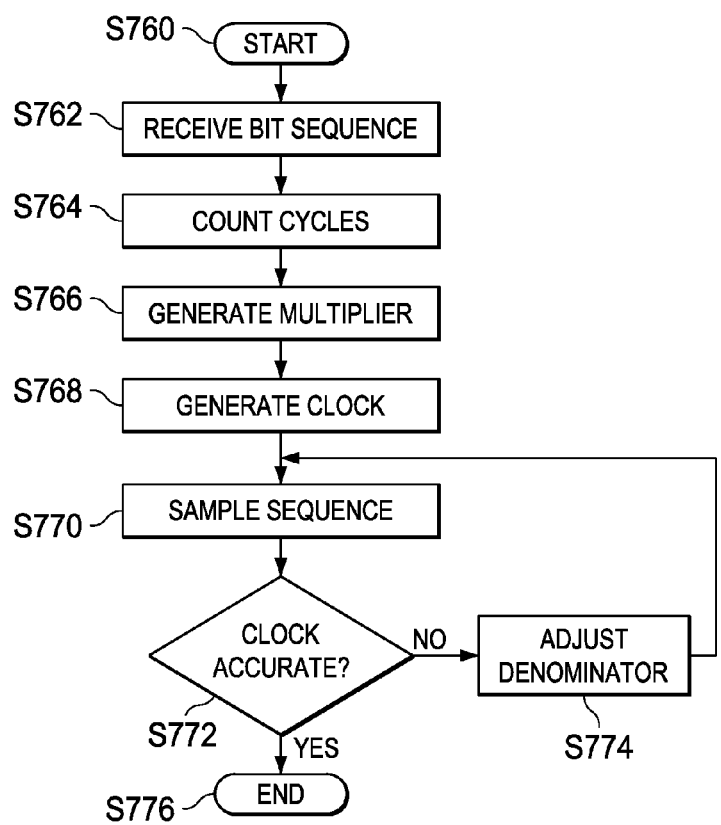
FIG. 7 shows a method for synchronizing a receiving UART, according to an exemplary embodiment of the present invention.

FIG. 7 shows a method for synchronizing a receiving device to a received serial bit stream, according to an exemplary embodiment of the present invention. The method begins S760 at a device configured in accordance with the present invention. Next, the device receives a predetermined bit sequence from a transmitter, sampling the bit sequence with a system clock, S762. Then, the device counts the number of system clock cycles over the interval of the predetermined bit sequence, S764. The resulting count is used to generate a multiplication factor by adjusting the denominator of a fractional rate multiplier equal to the count, S766. Then a data oversampling clock is generated by applying the fractional rate multiplier to the system clock, S768. The device then uses the oversampling clock to sample a serial bit stream from the transmitter, S770.

Figure 8:
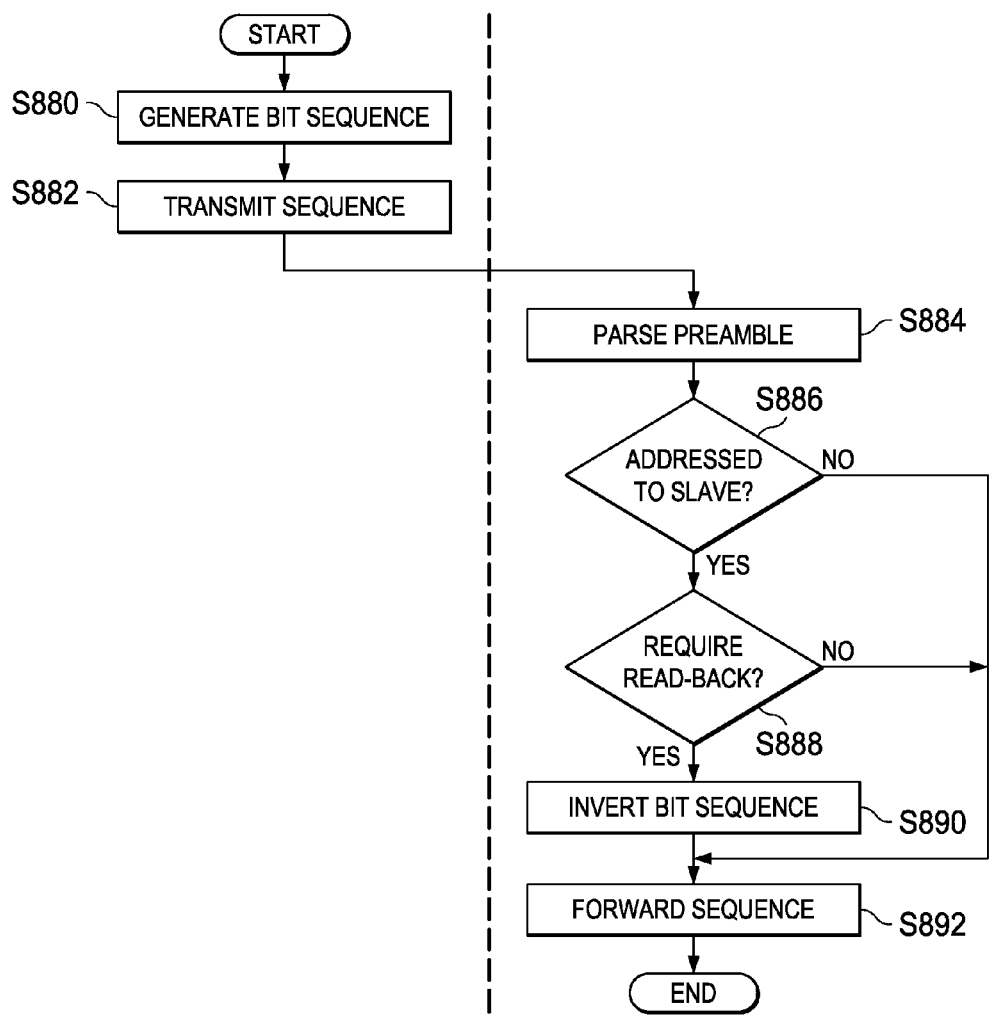
FIG. 8 shows a method for serial communication in a ring network, according to an exemplary embodiment of the present invention.

FIG. 8 shows a method for serial communication in a ring network, according to an exemplary embodiment of the present invention. The flow chart is divided by the dotted line. Events to the left of the dotted line are performed by a master device, while events to the right are performed by a slave device. Logic on the master device generates a serial bit stream, S880, and transmits the bit stream across the ring network, S882. The bit stream includes a predetermined bit sequence used by a slave device to synchronize to the baud rate of the bit stream an address identifying a destination slave, and instruction to read back data, and one or more placeholder bits for the read-back data. Logic on the slave device detects the predetermined bit sequence and synchronizes an oversampling clock to the baud rate of the bit stream, S884. The slave device then samples the bit stream using the oversampling clock to determine if the read back instruction is addressed to the slave device, S886. If a read-back is required, then one or more of the plurality of placeholder bits is altered by inverting the bit sequence, S890. In either case, the sequence, either inverted or not, is forwarded to a subsequent slave device on the ring network, S892.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for asynchronous serial communication, the method comprising:
   receiving at a receiving device a predetermined bit stream from a transmitter;
   counting a number of cycles of a system clock during the predetermined bit stream;
   generating a fractional rate multiplier having a numerator and a denominator, the denominator being based upon the counted number of system clock cycles;
   generating an oversampling clock by applying the fractional rate multiplier to the system clock;
   sampling a received data bit sequence using the oversampling clock, wherein the received data bit sequence includes voltage and temperature information for a plurality of cells in a battery management system;
   transmitting the bit sequence to a host controller for further diagnosis; and
   connecting a plurality of receiving devices and a transmitter in a ring network, wherein transmitter is a master and the receiving devices are designated as slaves, were in each slave receives data from the master and sends it to the next slave in the ring unaltered unless the master indicates a requirement for a particular data.

2. The method of claim 1, further comprising encoding the bit stream using non-return-to-zero (NRZ) encoding and communicating via a universal asynchronous receiver/transmitter (UART) protocol.

3. The method of claim 1, further comprising encoding the bit stream using continuous bi-frequency encoding.

4. The method of claim 1, further comprising;
   parsing the bit sequence to determine that the bit sequence is addressed to a slave and that the transmitter is requesting data back from the slave;
   filling in one of a plurality of placeholder bits in the bit sequence by inverting the bit sequence midway through the bit time; and
   forwarding the inverted bit sequence to a subsequent slave on the ring network.

5. The method of claim 1, further comprising: generating the system clock by using a pre-scale divider on a master clock.

6. The method of claim 1, further comprising: setting a constant numerator; and tuning the data sampling clock by adjusting the denominator.

7. The method of claim 1, wherein the predetermined bit sequence includes a start bit and a stop bit, the method further comprising counting the number of system clock cycles in response to receiving the start bit of the predetermined bit sequence.

8. A method for serial communication in a ring network, the method comprising:
   receiving, at a slave device, a bit sequence from a master device on the ring network, the bit sequence being encoded using bi-frequency encoding, wherein the received bit sequence includes voltage and temperature information for a plurality of cells in a battery management system;
   transmitting the bit sequence to a host controller for further diagnosis;
   synchronizing an oversampling clock to a baud rate of the received bit sequence;
   parsing the bit sequence to determine if the bit sequence is addressed to the slave device and that the master device is requesting data back from the slave;
   sending the bit sequence to the next slave in the ring unaltered unless the master indicates a requirement for a particular data;
   if the master device is requesting data back from the slave, filling in one of a plurality of placeholder bits in the bit sequence by inverting the bit sequence midway through the bit time; and
   forwarding the inverted bit sequence to a subsequent slave device on the ring network;
   wherein the start of each bit in the bit sequence is signaled by the master device inverting the bit sequence a first time to represent a 0 and a second time to represent a 1.

9. The method of claim 8, further comprising: determining that the master device requires no response; and forwarding the bit sequence to the next slave device unaltered.

10. The method of claim 8, wherein synchronizing the oversampling clock further comprises:
    monitoring a difference between a system clock and the baud rate of the transmitted bit sequence by counting a number of system clock cycles over a predetermined bit sequence;
    generating a fractional rate multiplier having a fixed numerator and a variable denominator, the denominator being equal to the counted number of system clock cycles;
    generating the oversampling clock by multiplying the system clock by the ratio of the numerator to the denominator; and
    sampling a data bit sequence from the transmitter using the oversampling clock.

11. A system for serial communication in a ring network, comprising:
    a master device;
    a plurality of slave devices connected to the master device forming the ring network;
    an interface between the master device and an external host device;
    logic on the master device for generating a bit stream and transmitting the bit sequence across the ring network, the bit stream comprising one or more placeholder bits for read-back data and voltage and temperature information for a plurality of cells in a battery management system;
    transmitting the bit sequence to a host controller for further diagnosis; and
    logic on a first slave device for parsing the bit stream to determine a destination address, and for adding any read-back data requested in the bit stream, the slave sending the bit sequence to the next slave in the ring unaltered if no data is requested by the master.

12. The system of claim 11, wherein the logic on the first slave device is further for:
    parsing the bit stream to determine that the bit stream is addressed to the first slave device;
    adding read-back data to the bit stream by altering one of the plurality of placeholder bits by inverting the bit stream midway through a predefined bit time; and
    forwarding the inverted bit stream to one of the plurality of slave devices on the ring network.

13. The system of claim 12, further comprising a host device that communicates with the master device via the interface.

14. The system of claim 13, wherein the plurality of slave devices are coupled to a cell, wherein the read-back data includes a voltage and a temperature for the cell, and wherein the host device is a controller in a battery management system.

15. The system of claim 14, further comprising logic on the interface for:
- counting a number of system clock cycles during reception of a predetermined bit sequence from the host device, wherein the predetermined bit sequence has a start bit and a stop bit and is encoded using non-return-to-zero (NRZ) encoding;
- generating a fractional rate multiplier having a numerator and a denominator, the denominator being based upon the counted number of system clock cycles;
- generating an oversampling clock by applying the fractional rate multiplier to the system clock; and
- sampling a data bit sequence from the host device using the data sampling clock.

16. The system of claim 15, wherein the logic further includes selecting a constant numerator, and tuning the data sampling clock by adjusting the denominator.

17. The system of claim 11, further comprising logic on the interface for:
- counting a number of system clock cycles during reception of a predetermined bit sequence from the host device;
- generating a fractional rate multiplier having a numerator and a denominator, the denominator being based upon the counted number of system clock cycles;
- generating an oversampling clock by applying the fractional rate multiplier to the system clock; and
- sampling a data bit sequence from the host device using the data sampling clock.

18. The system of claim 11, further comprising an X-OR gate coupled to the first slave device to invert the bit sequence, wherein the received data bit sequence includes voltage and temperature information for a plurality of cells in a battery management system, the method further comprising: transmitting the bit sequence to a host controller for further diagnosis.

* * * * *